United States Patent
Satyanarayana et al.

(10) Patent No.: US 11,054,446 B1
(45) Date of Patent: Jul. 6, 2021

(54) SYSTEM AND METHOD FOR LOAD CURRENT MEASUREMENT IN MULTIPORT POWER ADAPTERS

(71) Applicant: SILICONCH SYSTEMS PVT LTD, Karnataka (IN)

(72) Inventors: Burle Naga Satyanarayana, Andhra Pradesh (IN); Rakesh Kumar Polasa, Karnataka (IN); Shubham Paliwal, Uttar Pradesh (IN); Satish Anand Verkila, Karnataka (IN)

(73) Assignee: SILICONCH SYSTEMS PVT LTD, Karnataka (IN)

( * ) Notice: Subject to any disclaimer, the term of this patent is extended or adjusted under 35 U.S.C. 154(b) by 0 days.

(21) Appl. No.: 16/928,654

(22) Filed: Jul. 14, 2020

(30) Foreign Application Priority Data

Apr. 6, 2020 (IN) .............................. 202041015154

(51) Int. Cl.
*H02M 3/158* (2006.01)
*G01R 19/10* (2006.01)
*H02M 7/217* (2006.01)

(52) U.S. Cl.
CPC .......... *G01R 19/10* (2013.01); *H02M 3/1582* (2013.01); *H02M 7/217* (2013.01)

(58) Field of Classification Search
CPC .................................................... G01R 19/10
USPC ........................................................ 307/31
See application file for complete search history.

(56) References Cited

U.S. PATENT DOCUMENTS

| 6,541,879 B1* | 4/2003 | Wright | .................... | H02J 1/102 |
| | | | | 307/31 |
| 10,379,590 B2* | 8/2019 | Staude | .................. | G06Q 20/20 |

OTHER PUBLICATIONS

Universal Serial Bus Type-C Cable and Connector Specification Release 2.0, USB 3.0 Promoter Group, Aug. 2019 (373 pages).
Universal Serial Bus Power Delivery Specification, Revision 3.0, Version 2.0, Aug. 29, 2019 (657 pages).

* cited by examiner

*Primary Examiner* — Hai L Nguyen
(74) *Attorney, Agent, or Firm* — Procopio, Cory, Hargreaves & Savitch LLP

(57) ABSTRACT

The present disclosure provides a system and method including: a first USB port and one or more second USB ports provided on the multi-port adapter; an AC-DC conversion configured to measure a first load current at the first USB port; a plurality of buck-boost mode power conversion units, each configured to measure a second load current at a corresponding one or more second USB ports; and a system controller configured to measure the first load current and the one or more second load currents, wherein the system controller is configured to compare and adjust the measured first load current and the measured one or more second load currents to, respectively, a first rated current and a corresponding second rated current for each of the one or more second USB ports.

10 Claims, 5 Drawing Sheets

SYSTEM AND METHOD FOR LOAD CURRENT MEASUREMENT IN MULTIPORT POWER ADAPTERS

CROSS REFERENCE TO RELATED APPLICATIONS

This Paris Convention Patent Application claims benefit under 35 U.S.C. § 119 and claims priority to Indian Patent Application No. 202041015154, filed on Apr. 6, 2020, titled "SYSTEM AND METHOD FOR LOAD CURRENT MEASUREMENT IN MULTIPORT POWER ADAPTERS", the content of which is incorporated herein in its entirety by reference for all purposes.

TECHNICAL FIELD

The present disclosure generally relates to power adapters, and more specifically, to a method for measuring load current in multiport power adapters with regards to ensuring safe and reliable operation.

BACKGROUND

Background description includes information that can be useful in understanding the present invention. It is not an admission that any of the information provided herein is prior art or relevant to the presently claimed invention, or that any publication specifically or implicitly referenced is prior art.

Universal Serial Bus (USB) is an industry protocol designed to standardize interfaces between computing devices for communication and for supplying electrical power. The USB protocols have enjoyed widespread adoption in nearly every computing device and have received tremendous support in terms of technology development with well-established and standardized software infrastructure. USB is one of most common interfaces for connecting a variety of peripherals to computers and providing relatively local and small levels of data transfer. USB interfaces can be found on everything from personal computers and laptops, to peripheral devices, mobile phones, cameras, flash memory sticks, back up hard-drives and many other devices. USB has been implemented in several versions to meet data transfer and power requirements. The versions can be USB 1, USB 1.1, USB 2 and USB 3.

USB is a host-centric plug-and-play bus. A logical USB bus connects USB devices with USB host, using a physical tiered star topology. A system has one host with a hub at the centre of each star. Hubs convert a single attachment point (port) into multiple attachment points. The upstream port of a hub connects the hub towards the host. Each of the downstream ports of a hub allows connection to another hub or a function. Each wire segment is a point-to-point connection between the host and a hub or function, or a hub connected to another hub or function. A function of a USB device to transmit or receive data or control information over the bus and as such provide capabilities to the system. Examples of functions include locator devices, such as a mouse, tablet, or light pen, input devices, such as a keyboard or a scanner, output devices, such as a printer or digital speakers, and a telephony adapter. Each function contains configuration information that describes its capabilities and resource requirements. Before a function can be used, the host must configure it. This configuration includes allocating USB bandwidth and selecting function-specific configuration options.

USB ports are implemented extensively to connect peripheral devices to computing devices such as computer, laptop, personal digital assistant (PDA) etc. USB ports can be implemented for providing charging of various electronic devices and computing devices. There are general peripheral connections connected through USB can be printers, scanners, zip drives, digital cameras, mice, joysticks, modems, speakers, telephones, video phones and any other network connections. A USB cable, according to the USB standard, has a power supply line of +5V, a ground line, and two D+ and D- signal lines. The USB cable, according to the USB standard, can supply a predefined or predetermined current in mA at +5V while transmitting signals. A type of performing charging using this power supply is called USB charging. USB connectors are provided at either end of USB cable to enable connection between any or a combination of computing devices, electronic devices, power adapter etc. through USB ports. USB connectors can be of multiple types such as USB type-A connector, USB type-B connector, USB type-C connector, Mini-USB (of both type-A and type-B), Micro-USB (of both type-A and type-B) etc. According to USB connectors, there can be corresponding USB ports or sockets (such as type-A, type-B, type-C, Mini-USB, Micro-USB etc.).

The typical multiport USB (Type-A or Type-C) power adapters having a single AC-DC power conversion stage followed by buck-boost mode power converter. The AC-DC converter output is directly connected (through a VBUS Switch) to one of the USB Port and other buck-boost mode power converter connected to other USB port. This AC-DC converter and buck-boost mode power converters can work independently with different voltages and currents as per port partner (Sink) request. A system controller is provided, which is required read three currents from current sense resistors through the AC-DC converter and the buck-boost mode power converter to measure current through the one USB port and the other USB ports respectively. For instance, a current sense resistor RS3 can be used for current measurement of the one USB port and current sense resistors RS1 and RS2 can be used for current measurement of the other USB ports. This approach requires more hardware resources and memory. The buck-boost mode power converters (PMIC) uses high side current sense method, The AC-DC converter (PMIC) uses low side current sense method. The current monitoring in each port is very complex due to each power converter using different type of current measurement methods and each port having multiple load current limit points and different voltage ranges as per port partner request. In these multiport power adapter systems, multiple sink devices are connected and share a common ground because of system of connection of devices. For example, an external USB powered hub connected to a laptop or a PC, and they are simultaneously connected to multiport power adapter, which causes issues in measuring the current accurately across multiple ports. This stresses the power adapter because of wrongly measured currents.

In the current art, an input current of a buck-boost mode power converter changes based on its mode of operation. This can change the voltage drop across associated current sense resistors and the AC-DC converter measures current through another current sense resistor and it requires complex calculations, and this increases the firmware code size. This approach additionally may require 3 current sense resistors. It increases the system cost, requires more PCB space and reduces the system power conversion efficiency.

Therefore, there is a need in the art to provide a reliable and efficient a system and method for load current measurement in multiport power adapters.

SUMMARY

In some embodiments, the numbers expressing quantities or dimensions of items, and so forth, used to describe and claim certain embodiments of the invention are to be understood as being modified in some instances by the term "about." Accordingly, in some embodiments, the numerical parameters set forth in the written description and attached claims are approximations that may vary depending upon the desired properties sought to be obtained by a particular embodiment. In some embodiments, the numerical parameters should be construed in light of the number of reported significant digits and by applying ordinary rounding techniques. Notwithstanding that the numerical ranges and parameters setting forth the broad scope of some embodiments of the invention are approximations, the numerical values set forth in the specific examples are reported as precisely as practicable. The numerical values presented in some embodiments of the invention may contain certain errors necessarily resulting from the standard deviation found in their respective testing measurements.

As used in the description herein and throughout the claims that follow, the meaning of "a," "an," and "the" includes plural reference unless the context clearly dictates otherwise. Also, as used in the description herein, the meaning of "in" includes "in" and "on" unless the context clearly dictates otherwise.

Groupings of alternative elements or embodiments of the invention disclosed herein are not to be construed as limitations. Each group member can be referred to and claimed individually or in any combination with other members of the group or other elements found herein. One or more members of a group can be included in, or deleted from, a group for reasons of convenience and/or patentability. When any such inclusion or deletion occurs, the specification is herein deemed to contain the group as modified thus fulfilling the written description of all groups used in the appended claims.

It is an object of the present disclosure to provide a system and method for load current measurement in multiport power adapters.

It is another object of the present disclosure to provide a simple and cost-effective system and method for load current measurement in multiport power adapters.

It is another object of the present disclosure to provide a reliable and efficient system and method for load current measurement in multiport power adapters.

It is another object of the present disclosure to provide a robust system and method for load current measurement in multiport power adapters.

The present disclosure generally relates to power adapters, and more specifically, to a method for measuring load current in multiport power adapters with regards to ensuring safe and reliable operation.

This summary is provided to introduce simplified concepts of a system for time bound availability check of an entity, which are further described below in the detailed description. This summary is not intended to identify key or essential features of the claimed subject matter, nor is it intended for use in determining/limiting the scope of the claimed subject matter.

In an aspect, present disclosure provides a system for measuring load current in a multi-port power adapter, the system including: a first USB port and one or more second USB ports provided on the multi-port adapter; an AC-DC conversion unit electrically connected to the first USB port and configured to measure a first load current at the first USB port; a plurality of buck-boost mode power conversion units, each of the plurality of buck-boost mode power conversion units (composed of buck-boost mode power converter controller and buck-boost mode power converter circuit) electrically connected to a second USB port of the one or more second USB ports, and each configured to measure a second load current at the corresponding one or more second USB ports; and a system controller configured to measure the first load current through the AC-DC conversion unit and one or more second load currents through the corresponding buck-boost mode power conversion units, wherein the system controller is configured to measure the first load current by means of a low side current sense method, and the one or more second load currents by means of a high side current sense method, and wherein the system controller is further configured to compare and adjust the measured first load current and the measured one or more second load currents to, respectively, a first rated current and a corresponding second rated current for each of the one or more second USB ports.

In an embodiment, the system controller interacts with the AC-DC conversion unit and buck-boost mode power conversion unit through a digital interface selected from any or a combination of Inter-Integrated Circuit (I2C), General Purpose Input-Output (GPIO), other inter chip communication method and by using analogue feedback control signals. In another embodiment, the first USB port and the one or more second USB ports are selected from a group comprising type-A port, type-C port and combinations thereof.

In another embodiment, the AC-DC conversion unit and the buck-boost mode power conversion units have an electrical correspondence with each other through a VOUT line.

In another embodiment, the multiport adapter is configured to support (e.g., be compatible with) one or more of common ground and individual ground-based sink devices.

In an aspect, the present disclosure provides a method for measuring load current in in a multiport power adapter, the method including measuring, by means of a system controller, a first load current and one or more second load currents associated with a first USB port and one or more second USB ports, said first USB port and said one or more second USB ports provided on the multiport power adapter, wherein the system controller is configured to measure the first load current by means of a low side current sense method, and the one or more second load currents by means of a high side current sense method; and comparing, by means of the system controller, the measured first load current and the measured one or more second load currents against, respectively, a first rated current and a corresponding second rated current for each of the one or more second USB ports, wherein the system controller is configured to adjust the measured first load current and the measured one or more second load currents to the first rated current and the corresponding one or more second rated currents respectively.

In an embodiment, the first load current is associated with an AC-DC conversion unit, and each of the one or more second load currents is associated with a corresponding buck-boost mode power conversion unit.

In another embodiment, the system controller interacts with the AC-DC conversion unit and buck-boost mode power conversion unit through a digital interface selected from any or a combination of I2C, GPIO, other inter chip communication method and by using analogue feedback control signals. In another embodiment, the first USB port and the one or more second USB ports are selected from a group comprising type-A port, type-C port and combinations thereof.

In another embodiment, the AC-DC conversion unit and the buck-boost mode power conversion units have an electrical correspondence with each other through a VOUT line.

Various objects, features, aspects and advantages of the inventive subject matter will become more apparent from the following detailed description of preferred embodiments, along with the accompanying drawing figures in which like numerals represent like components.

BRIEF DESCRIPTION OF THE DRAWINGS

The diagrams are for illustration only, which thus is not a limitation of the present disclosure, and wherein.

DETAILED DESCRIPTION

Figure 1:
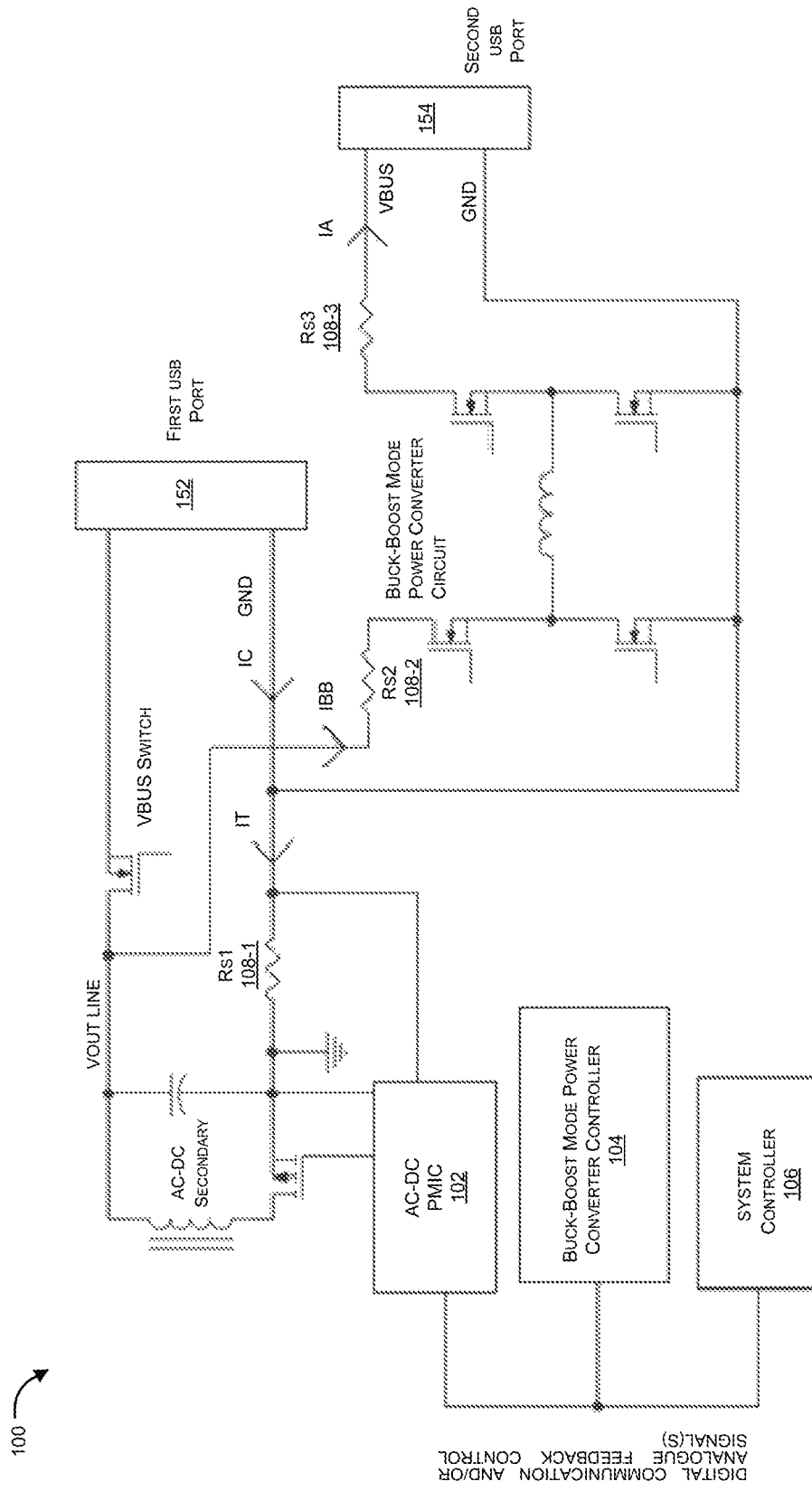
FIG. 1 illustrates a schematic representation of a system for measuring load currents through ports of a USB multi-port power adapter, as known in the art.

The following is a detailed description of embodiments of the disclosure depicted in the accompanying drawings. The embodiments are in such detail as to clearly communicate the disclosure. However, the amount of detail offered is not intended to limit the anticipated variations of embodiments; on the contrary, the intention is to cover all modifications, equivalents, and alternatives falling within the spirit and scope of the present disclosure as defined by the appended claims.

In the following description, numerous specific details are set forth in order to provide a thorough understanding of embodiments of the present invention. It will be apparent to one skilled in the art that embodiments of the present invention may be practiced without some of these specific details.

Embodiments of the present invention include various steps, which will be described below. The steps may be performed by hardware components or may be embodied in machine-executable instructions, which may be used to cause a general-purpose or special-purpose processor programmed with the instructions to perform the steps. Alternatively, steps may be performed by a combination of hardware, software, and firmware and/or by human operators.

Various methods described herein may be practiced by combining one or more machine-readable storage media containing the code according to the present invention with appropriate standard computer hardware to execute the code contained therein. An apparatus for practicing various embodiments of the present invention may involve one or more computers (or one or more processors within a single computer) and storage systems containing or having network access to computer program(s) coded in accordance with various methods described herein, and the method steps of the invention could be accomplished by modules, routines, subroutines, or subparts of a computer program product.

If the specification states a component or feature "may", "can", "could", or "might" be included or have a characteristic, that particular component or feature is not required to be included or have the characteristic.

As used in the description herein and throughout the claims that follow, the meaning of "a," "an," and "the" includes plural reference unless the context clearly dictates otherwise. Also, as used in the description herein, the meaning of "in" includes "in" and "on" unless the context clearly dictates otherwise.

Exemplary embodiments will now be described more fully hereinafter with reference to the accompanying drawings, in which exemplary embodiments are shown. These exemplary embodiments are provided only for illustrative purposes and so that this disclosure will be thorough and complete and will fully convey the scope of the invention to those of ordinary skill in the art. The invention disclosed may, however, be embodied in many different forms and should not be construed as limited to the embodiments set forth herein. Various modifications will be readily apparent to persons skilled in the art. The general principles defined herein may be applied to other embodiments and applications without departing from the spirit and scope of the invention. Moreover, all statements herein reciting embodiments of the invention, as well as specific examples thereof, are intended to encompass both structural and functional equivalents thereof. Additionally, it is intended that such equivalents include both currently known equivalents as well as equivalents developed in the future (i.e., any elements developed that perform the same function, regardless of structure). Also, the terminology and phraseology used is for the purpose of describing exemplary embodiments and should not be considered limiting. Thus, the present invention is to be accorded the widest scope encompassing numerous alternatives, modifications and equivalents consistent with the principles and features disclosed. For purpose of clarity, details relating to technical material that is known in the technical fields related to the invention have not been described in detail so as not to unnecessarily obscure the present invention.

Thus, for example, it will be appreciated by those of ordinary skill in the art that the diagrams, schematics, illustrations, and the like represent conceptual views or processes illustrating systems and methods embodying this invention. The functions of the various elements shown in the figures may be provided through the use of dedicated hardware as well as hardware capable of executing associated software. Similarly, any switches shown in the figures are conceptual only. Their function may be carried out through the operation of program logic, through dedicated logic, through the interaction of program control and dedicated logic, or even manually, the particular technique being selectable by the entity implementing this invention. Those of ordinary skill in the art further understand that the exemplary hardware, software, processes, methods, and/or operating systems described herein are for illustrative purposes and, thus, are not intended to be limited to any particular named element.

Embodiments of the present invention may be provided as a computer program product, which may include a machine-readable storage medium tangibly embodying thereon instructions, which may be used to program a computer (or other electronic devices) to perform a process. The term "machine-readable storage medium" or "computer-readable storage medium" includes, but is not limited to, fixed (hard) drives, magnetic tape, floppy diskettes, optical disks, compact disc read-only memories (CD-ROMs), and magneto-optical disks, semiconductor memories, such as ROMs, PROMs, random access memories (RAMs), programmable read-only memories (PROMs), erasable PROMs (EPROMs), electrically erasable PROMs (EEPROMs), flash memory, magnetic or optical cards, or other type of media/machine-readable medium suitable for storing electronic instructions (e.g., computer programming code, such as software or firmware). A machine-readable medium may include a non-transitory medium in which data may be stored and that does not include carrier waves and/or transitory electronic signals propagating wirelessly or over wired connections. Examples of a non-transitory medium may include, but are not limited to, a magnetic disk or tape, optical storage media such as compact disk (CD) or digital versatile disk (DVD), flash memory, memory or memory devices. A computer-program product may include code and/or machine-executable instructions that may represent a procedure, a function, a subprogram, a program, a routine, a subroutine, a module, a software package, a class, or any combination of instructions, data structures, or program statements. A code segment may be coupled to another code segment or a hardware circuit by passing and/or receiving information, data, arguments, parameters, or memory contents. Information, arguments, parameters, data, etc. may be passed, forwarded, or transmitted via any suitable means including memory sharing, message passing, token passing, network transmission, etc.

Furthermore, embodiments may be implemented by hardware, software, firmware, middleware, microcode, hardware description languages, or any combination thereof. When implemented in software, firmware, middleware or microcode, the program code or code segments to perform the necessary tasks (e.g., a computer-program product) may be stored in a machine-readable medium. A processor(s) may perform the necessary tasks.

Systems depicted in some of the figures may be provided in various configurations. In some embodiments, the systems may be configured as a distributed system where one or more components of the system are distributed across one or more networks in a cloud computing system.

Each of the appended claims defines a separate invention, which for infringement purposes is recognized as including equivalents to the various elements or limitations specified in the claims. Depending on the context, all references below to the "invention" may in some cases refer to certain specific embodiments only. In other cases, it will be recognized that references to the "invention" will refer to subject matter recited in one or more, but not necessarily all, of the claims.

All methods described herein may be performed in any suitable order unless otherwise indicated herein or otherwise clearly contradicted by context. The use of any and all examples, or exemplary language (e.g., "such as") provided with respect to certain embodiments herein is intended merely to better illuminate the invention and does not pose a limitation on the scope of the invention otherwise claimed. No language in the specification should be construed as indicating any non-claimed element essential to the practice of the invention.

Various terms as used herein are shown below. To the extent a term used in a claim is not defined below, it should be given the broadest definition persons in the pertinent art have given that term as reflected in printed publications and issued patents at the time of filing.

FIG. 1 illustrates a schematic representation of a system for measuring load currents through ports of a USB multiport power adapter, as known in the art. The multiport power adapter 100 can be provided with a first USB port 152 and a number of second USB ports 154. The multiport power adapter 100 is provided with a single AC-DC power converter 102 followed by a buck-boost mode power converter controller 104. Output of the AC-DC converter 102 is directly connected, through a VBUS switch, to the first USB port 152 and the second USB ports 154 are connected to the buck-boost mode power converter controller 104. Output of the AC-DC converter 102 is given to the buck-boost mode power converter controller 104 input. The buck-boost mode power converter controller 104 can operate in buck and in boost modes based on input voltage (AC-DC secondary voltage) and request from port partner (sink). The AC-DC 102 PMIC and the buck-boost mode power converter controller 104 (PMIC) can be from different manufacturers and they use different current sense methods.

A system controller 106 is provided in the system 100, which is required to read three currents from three current sense resistors—RS1 (108-1), RS2 (108-2) and RS3 (108-3), through the AC-DC converter 102 and the buck-boost mode power converter controller 104 to measure current through the first USB port 152 and the second USB ports 154 respectively. The current sense resistor RS1 (108-1) and RS2 (108-2) are used for current measurement of the first USB port 152 and the current sense resistors RS3 (108-3) is used for current measurement of the second USB ports 154. This approach requires more hardware resources and memory.

When the buck-boost mode power converter controller 104 is working in boost mode, the input current (IBB) is greater than the output current (IA), and when the buck-boost mode power converter controller 104 is working in buck mode, the input current (IBB) is lower than the output current (IA). The buck mode or boost mode operation depends on the input voltage and the output voltage of the buck-boost mode power converter controller 104. The input current of buck-boost mode power converter 104 (IBB) changes based on mode of operation (even if IA is constant). This can change the voltage drop across RS1 (108-1) and AC-DC 102 (PMIC). The approach requires 3 current sense resistors, which increases the system cost, requires more PCB space and reduces the system power conversion efficiency.

In implementations of multiport power adapters known in the art, the multi-port adapters suffer from inaccurate current measurement thereby stressing the power adapter. In these multiport power adapter systems, multiple sink devices are connected and share a common ground because of system of connection of devices. For example, an external USB powered hub connected to a laptop or a PC, and they are simultaneously connected to multiport power adapter, which causes issues in measuring the current accurately across multiple ports. This stresses the power adapter because of wrongly measured currents.

The present disclosure generally relates to power adapters, and more specifically, to a method for measuring load current in multiport power adapters with regards to ensuring safe and reliable operation.

In an aspect, present disclosure provides a system for measuring load current in a multi-port power adapter, the system including: a first USB port and one or more second USB ports provided on the multi-port adapter; an AC-DC conversion unit electrically connected to the first USB port and configured to measure a first load current at the first USB port; a plurality of buck-boost mode power conversion units, each of the plurality of buck-boost mode power conversion units (composed of buck-boost mode power converter controller and buck-boost mode power converter circuit) electrically connected to a second USB port of the one or more second USB ports, and each configured to measure a second load current at the corresponding one or more second USB ports; and a system controller configured to measure the first load current through the AC-DC conversion unit and one or more second load currents through the corresponding buck-boost mode power conversion units, wherein the system controller is configured to measure the first load current by means of a low side current sense method, and the one or more second load currents by means of a high side current sense method, and wherein the system controller is further configured to compare and adjust the measured first load current and the measured one or more second load currents to, respectively, a first rated current and a corresponding second rated current for each of the one or more second USB ports.

In an embodiment, the system controller interacts with the AC-DC conversion unit and buck-boost mode power conversion unit through a digital interface selected from any or a combination of I2C, GPIO, other inter chip communication method and by using analogue feedback control signals. In another embodiment, the first USB port and the one or more second USB ports are selected from a group comprising type-A port, type-C port and combinations thereof.

In another embodiment, the AC-DC conversion unit and the buck-boost mode power conversion units have an electrical correspondence with each other through a VOUT line.

In another embodiment, the multiport adapter is configured to support (e.g., be compatible with) one or more of common ground and individual ground-based sink devices.

In an aspect, the present disclosure provides a method for measuring load current in in a multiport power adapter, the method involving measuring, by means of a system controller, a first load current and one or more second load currents associated with a first USB port and one or more second USB ports, said first USB port and said one or more second USB ports provided on the multiport power adapter, wherein the system controller is configured to measure the first load current by means of a low side current sense method, and the one or more second load currents by means of a high side current sense method; and comparing, by means of the system controller, the measured first load current and the measured one or more second load currents against, respectively, a first rated current and a corresponding second rated current for each of the one or more second USB ports, wherein the system controller is configured to adjust the measured first load current and the measured one or more second load currents to the first rated current and the corresponding one or more second rated currents respectively.

In an embodiment, the first load current is associated with an AC-DC conversion unit, and each of the one or more second load currents is associated with a corresponding buck-boost mode power conversion unit.

In another embodiment, the system controller interacts with the AC-DC conversion unit and buck-boost mode power conversion unit through a digital interface selected from any or a combination of I2C, GPIO, other inter chip communication method and by using analogue feedback control signals. In another embodiment, the first USB port and the one or more second USB ports are selected from a group comprising type-A port, type-C port and combinations thereof.

In another embodiment, the AC-DC conversion unit and the buck-boost mode power conversion units have an electrical correspondence with each other through a VOUT line.

Figure 2:
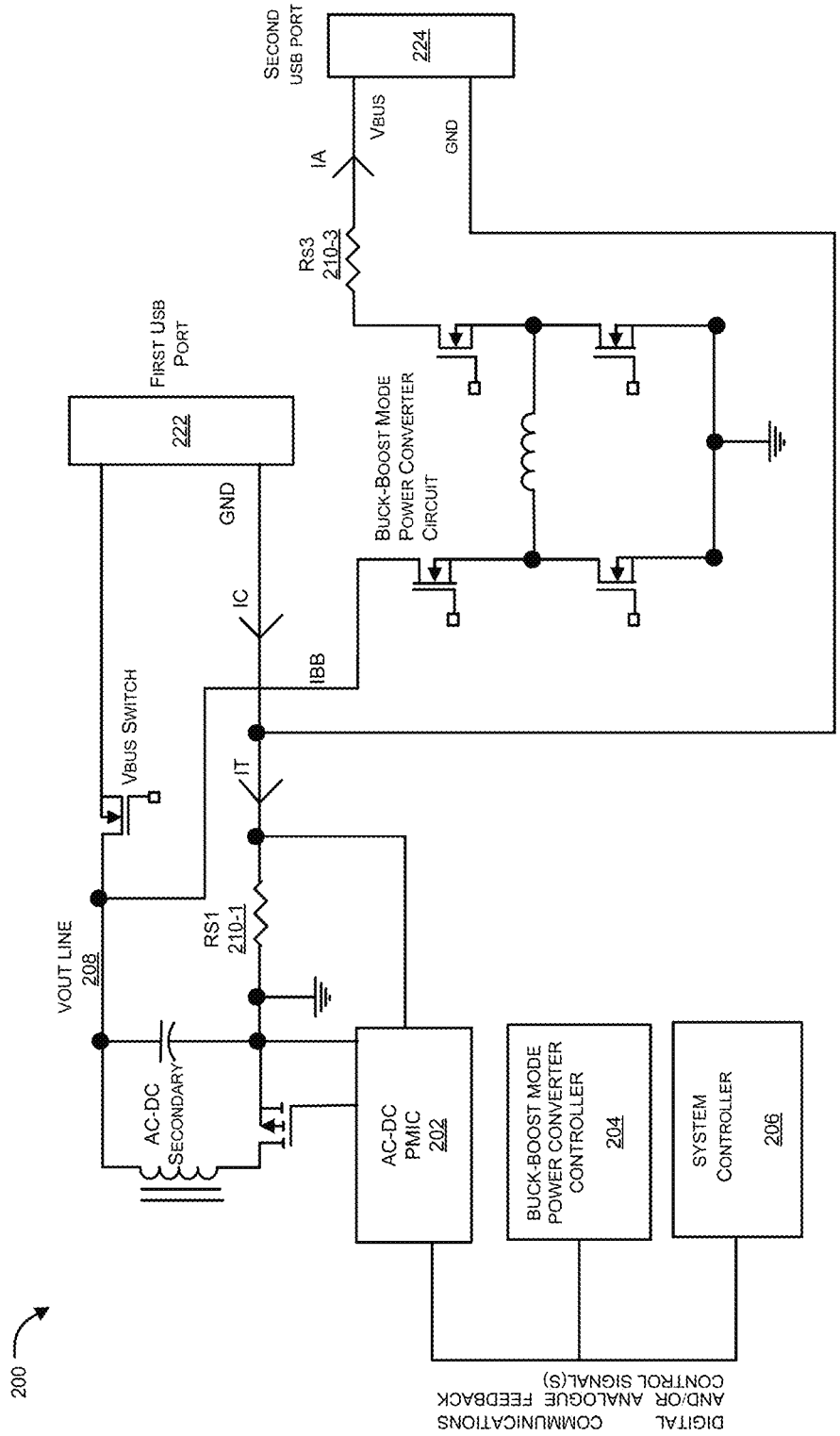
FIG. 2 illustrates an exemplary schematic representation of a system for measuring load currents through ports of a USB multiport power adapter, in accordance with an embodiment of the present disclosure.

FIG. 2 illustrates an exemplary schematic representation of a system for measuring load currents through ports of a USB multiport power adapter, in accordance with an embodiment of the present disclosure. The system 200 is associated with a multiport power adapter with the representation showing two ports while in other embodiments, a plurality of ports can be present. The multiport power adapter can include an AC-DC conversion unit 202, a buck-boost mode power conversion unit 204, and a system controller 206. The AC-DC conversion unit 202 and the buck-boost mode power conversion unit 204 are in electrical correspondence with each other by means of a VOUT line 208. The power adapter (with respect to system 200) can include a first port 222 and a second port 224. The first port 222 can be a type-C USB port while the second port 224 can be a type-A USB port.

The AC-DC conversion unit 202 is electrically connected to a first USB port 222 through a corresponding VBUS switch and configured to measure a first load current at the first USB port 222 while the buck-boost mode power converter controller 204 is electrically connected to a second USB port 224. The AC-DC conversion unit 202 is based on a PMIC as is known in the art and can operate independently with respect to the buck-boost mode power converter controller 204 which is also based on a PMIC as is known in the art. In other words, the AC-DC conversion unit 202 and the buck-boost mode power converter controller 204 can work independently with different voltages and currents based on port partner (Sink) requests.

The buck-boost mode power converter controller 204 is configured to measure a second load current at the second USB port 224. The buck boost mode power converter controller 204 while working in boost mode operation, the input current (IBB) is more than output current (IA), while working in buck mode operation the input current (IBB) is less than output current (IA). The Buck mode or boost mode operation depends on input voltage and output voltage of the buck boost mode power converter controller 204. Referring now to FIG. 2, the input current of buck-boost mode power converter (IBB) changes based on mode of operation (even if IA is constant).

The system controller 206 is configured to measure the first load current by means of a low side current sense method, and the second load current by means of a high side current sense method. Both these methods are known in the art and can be implemented in accordance with the desired implementation. The system controller 206 includes a logic unit (not shown) which can be programmed to perform functions herein disclosed such as a programmable hardware processor, a field programmable gate array (FPGA), or otherwise in accordance with the desired implementation. The method in this case is focused on optimizing the ground current path in the system 200. By means of sense resistors RS1 (210-1) and RS3 (210-3), as shown in FIG. 2, the system controller 206 measures only Type-C port and Type-A port currents (IC+IA) irrespective of the mode of operation (buck boost conversion unit). Referring again to FIG. 2, the system controller 206 is configured to perform its operation in the following manner: Total current (Type-A+Type-C)=(Voltage drop across RS1)/(RS1); Type-A port current=(Voltage drop across RS3)/(RS3); and Type-C port current=(Total current−Type-A port current).

With regards to the above syntax, the system controller 206 performs optimally to safely provide power to sink device or other relevant devices as can be appreciated by a person skilled in the art. The method can involve measuring, by means of the system controller 206, a first load current and a second load current associated with a first USB port 222 and a second USB port 224 respectively; comparing, by means of the system controller 206, the measured first load current and the measured second load current as against a first rated current and a second rated current respectively; adjusting, by means of the system controller 206, the measured first load current and the measured second load current to the first rated current and the second rated current respectively. By this manner, the system controller integrates both the high-side and low-side based current measurement power conversion methods. The system controller 206 accordingly monitors and controls each port currents through digital communication and/or analogue feedback control signals. If the load current of anyone of the port or more than one ports increases beyond its rated value, the system controller enables the protection logic for safe operation.

Figure 3:
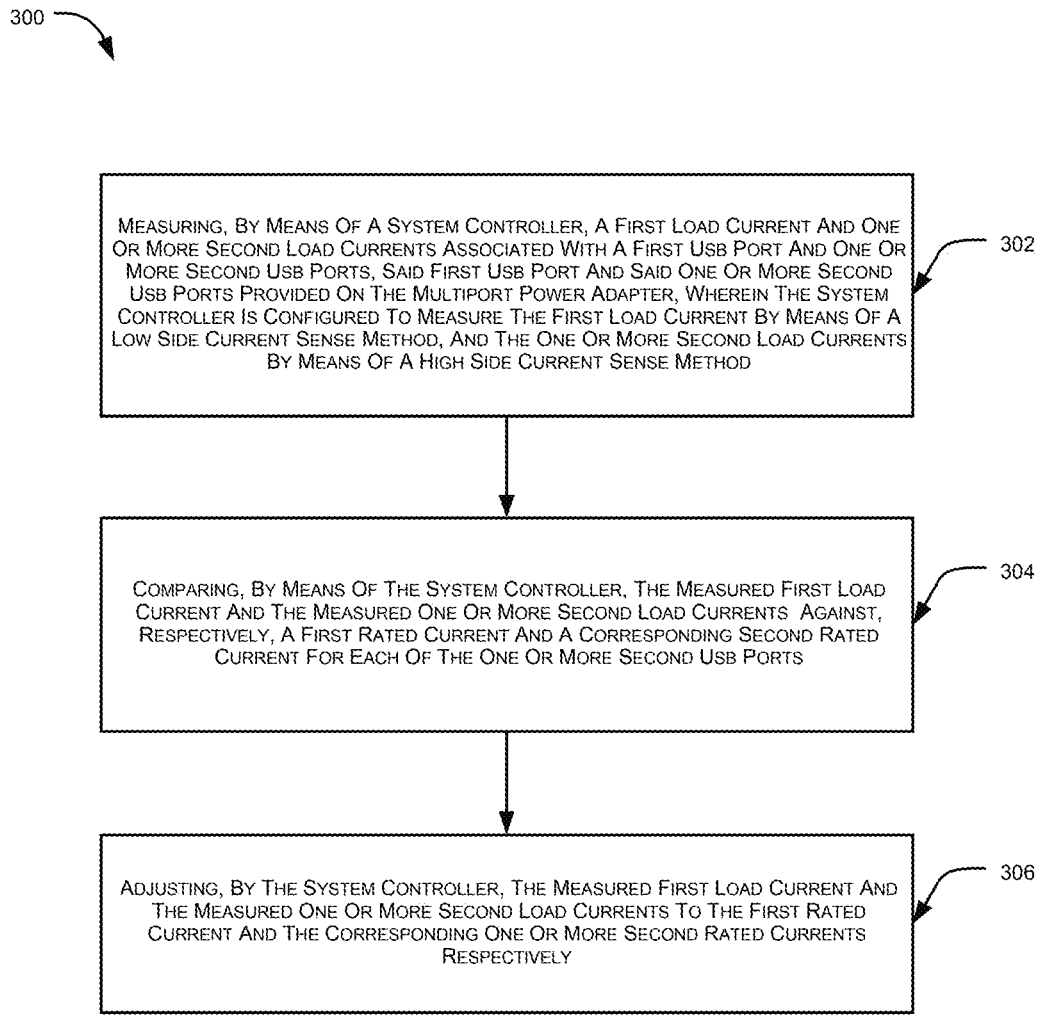
FIG. 3 illustrates an exemplary flow diagram for a method for safely and reliably measuring load currents through ports of a USB multi-port power adapter, in accordance with an embodiment of the present disclosure.

FIG. 3 illustrates an exemplary flow diagram for a method for safely and reliably measuring load currents through ports of a USB multi-port power adapter, in accordance with an embodiment of the present disclosure. The method 300 includes the steps of:

302—measuring, by means of a system controller, a first load current and one or more second load currents associated with a first USB port and one or more second USB ports, said first USB port and said one or more second USB ports provided on the multiport power adapter, wherein the system controller is configured to measure the first load current by means of a low side current sense method, and the one or more second load currents by means of a high side current sense method;

304—comparing, by means of the system controller, the measured first load current and the measured one or more second load currents against, respectively, a first rated current and a corresponding second rated current for each of the one or more second USB ports; and

306—adjusting, by the system controller, the measured first load current and the measured one or more second load currents to the first rated current and the corresponding one or more second rated currents respectively.

The proposed system, when compared to the system known in the art (FIG. 1), eliminates one current sense resistor (RS2), thereby reducing the current measurement complexity and simplifying the current measurement calculations, which saves the system cost and reduces the firmware code size.

A further advantage of the proposed system is that it eliminates issues of inaccurate current measurement associated with a common ground present in many existing power adapters, thereby providing reliable measured values of current for safe operation in multiport power adapters.

Figure 4A:
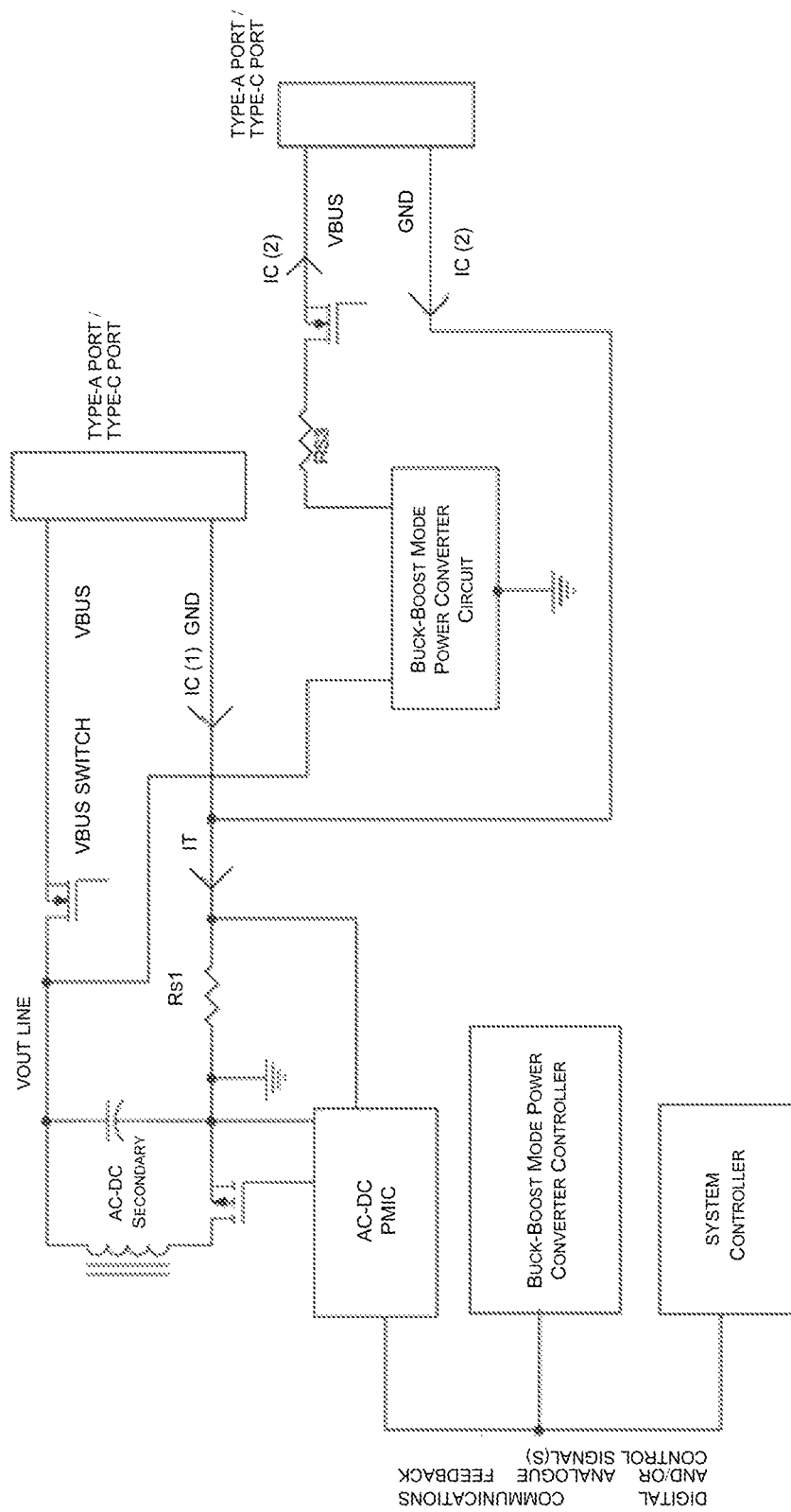
FIGS. 4A and 4B illustrate exemplary schematic representations of implementations of the proposed system for measuring load currents through ports of a USB multi-port power adapter with Type-A and Type-C USB ports, in accordance with an embodiment of the present disclosure.
Figure 4B:
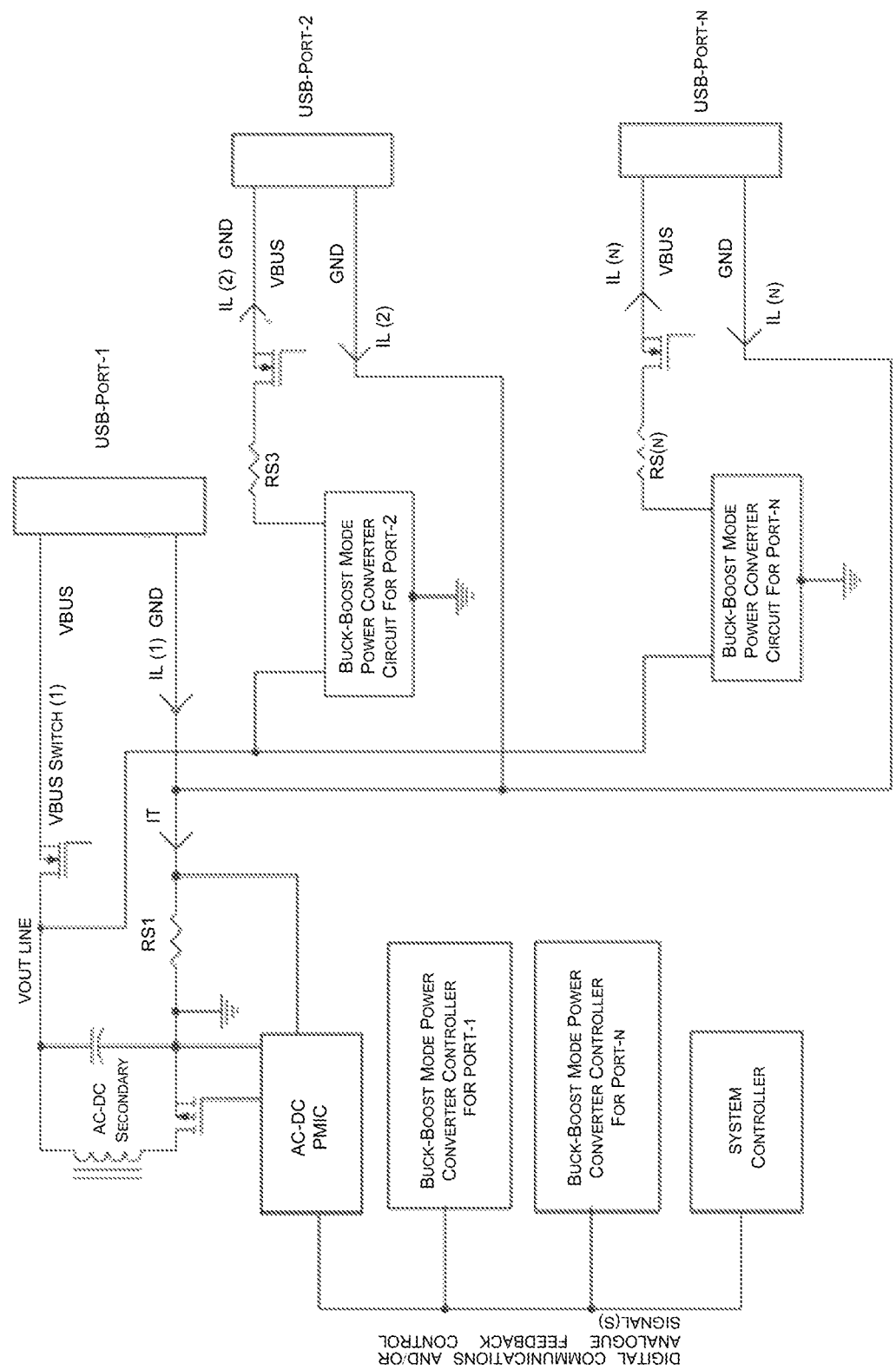

FIGS. 4A and 4B illustrate exemplary schematic representations of implementations of the proposed system for measuring load currents through ports of a USB multi-port power adapter with Type-A and Type-C USB ports, in accordance with an embodiment of the present disclosure.

In an exemplary embodiment, the USB ports used can be any or a combination of Type-A port, Type-C port.

In another exemplary embodiment, when the USB ports provided in the multiport adapter are all Type-C ports, the system controller can be a USB-PD controller.

The above-mentioned method is envisioned to be performed using appropriate physical devices that may be appreciated by a person skilled in the art. As such all physical devices comprising respective various physical materials serve their respective functions and all such materials and their respective manufacturing methods are intended to be covered by this disclosure.

Thus, it will be appreciated by those of ordinary skill in the art that the diagrams, schematics, illustrations, and the like represent conceptual views or processes illustrating systems and methods embodying this invention. The functions of the various elements shown in the figures can be provided through the use of dedicated hardware as well as hardware capable of executing associated software. Similarly, any switches shown in the figures are conceptual only. Their function can be carried out through the operation of program logic, through dedicated logic, through the interaction of program control and dedicated logic, or even manually, the particular technique being selectable by the entity implementing this invention. Those of ordinary skill in the art further understand that the exemplary hardware, software, processes, methods, and/or operating systems described herein are for illustrative purposes and, thus, are not intended to be limited to any particular named.

While embodiments of the present invention have been illustrated and described, it will be clear that the invention is not limited to these embodiments only. Numerous modifications, changes, variations, substitutions, and equivalents will be apparent to those skilled in the art, without departing from the spirit and scope of the invention, as described in the claim.

In the foregoing description, numerous details are set forth. It will be apparent, however, to one of ordinary skill in the art having the benefit of this disclosure, that the present invention can be practiced without these specific details. In some instances, well-known structures and devices are shown in block diagram form, rather than in detail, to avoid obscuring the present invention.

As used herein, and unless the context dictates otherwise, the term "coupled to" is intended to include both direct coupling (in which two elements that are coupled to each other contact each other) and indirect coupling (in which at least one additional element is located between the two elements). Therefore, the terms "coupled to" and "coupled with" are used synonymously. Within the context of this document terms "coupled to" and "coupled with" are also used euphemistically to mean "communicatively coupled with" over a network, where two or more devices are able to exchange data with each other over the network, possibly via one or more intermediary device.

It should be apparent to those skilled in the art that many more modifications besides those already described are possible without departing from the inventive concepts herein. The inventive subject matter, therefore, is not to be restricted except in the spirit of the appended claims. Moreover, in interpreting both the specification and the claims, all terms should be interpreted in the broadest possible manner consistent with the context. In particular, the terms "comprises" and "comprising" should be interpreted as referring to elements, components, or steps in a non-exclusive manner, indicating that the referenced elements, components, or steps can be present, or utilized, or combined with other elements, components, or steps that are not expressly referenced. Where the specification claims refers to at least one of something selected from the group consisting of A, B, C ... and N, the text should be interpreted as requiring only one element from the group, not A plus N, or B plus N, etc.

While the foregoing describes various embodiments of the invention, other and further embodiments of the invention can be devised without departing from the basic scope thereof. The scope of the invention is determined by the claims that follow. The invention is not limited to the described embodiments, versions or examples, which are included to enable a person having ordinary skill in the art to make and use the invention when combined with information and knowledge available to the person having ordinary skill in the art.

Through the example embodiments herein, the present disclosure provides a system and method for load current measurement in multiport power adapters.

Through the example embodiments herein, the present disclosure provides a simple and cost-effective system and method for load current measurement in multiport power adapters.

Through the example embodiments herein, the present disclosure provides a reliable and efficient system and method for load current measurement in multiport power adapters.

Through the example embodiments herein, the present disclosure provides a robust system and method for load current measurement in multiport power adapters.

In multiport power adapter systems, typically, multiple connected sink devices share a common ground, which causes issues in measuring the current accurately across multiple ports, resulting in stressing the multiport power adapter because of wrongly measured currents. The present disclosure provides a system and method to overcome this limitation. Through the example embodiments herein, the present disclosure eliminates issues of inaccurate current measurement associated with a common ground present in existing power adapters, thereby providing reliable measured values of current for safe operation in multiport power adapters.

We claim:

1. A system for measuring load currents in a multi-port power adapter, the system comprising:
   a first USB port and one or more second USB ports provided on the multi-port adapter;
   an AC-DC conversion unit electrically connected to the first USB port and configured to measure a first load current at the first USB port;
   a plurality of buck-boost mode power conversion units, each of the plurality of buck-boost mode power conversion units electrically connected to a second USB port of the one or more second USB ports, and each configured to measure one or more second load currents at the corresponding one or more second USB ports; and
   a system controller configured to measure the first load current through the AC-DC conversion unit and one or more second load currents through the corresponding buck-boost mode power conversion units;
   wherein the system controller is configured to measure the first load current by means of a low side current sense method, and the one or more second load currents by means of a high side current sense method, and
   wherein the system controller is further configured to compare and adjust the measured first load current and the measured one or more second load currents to, respectively, a first rated current and corresponding one or more second rated currents for each of the one or more second USB ports.

2. The system as claimed in claim 1, wherein the system interacts with the AC-DC conversion unit and the buck-boost mode power conversion unit through use of analogue feedback control signals and through a digital interface selected from one or more of Inter-Integrated Circuit (I2C), General Purpose Input-Out (GPIO), and other inter chip communication methods.

3. The system as claimed in claim 1, wherein each of the first USB port and the one or more second USB ports are a type-A port or type-C port.

4. The system as claimed in claim 3, wherein the AC-DC conversion unit and the buck-boost mode power conversion units have an electrical correspondence with each other through a VOUT line.

5. The system as claimed in claim 4, wherein the multiport adapter is configured to support one or more of common and individual ground-based sink devices.

6. A method for measuring load currents in a multiport power adapter, the method comprising the steps of:
   measuring, with a system controller, a first load current and one or more second load currents associated with a first USB port and one or more second USB ports, said first USB port and said one or more second USB ports are provided on the multiport power adapter, wherein the system controller is configured to measure the first load current by means of a low side current sense method, and the one or more second load currents by means of a high side current sense method; and
   comparing, with the system controller, the measured first load current and the measured one or more second load currents against, respectively, a first rated current and a corresponding one or more second rated currents for each of the one or more second USB ports,
   wherein the system controller is configured to adjust the measured first load current and the measured one or more second load currents to the first rated current and the corresponding one or more second rated currents respectively.

7. The method as claimed in claim 6, wherein the first load current is associated with an AC-DC conversion unit, and each of the one or more second load currents is associated with a corresponding buck-boost mode power conversion unit.

8. The method as claimed in claim 6, wherein the system controller interacts with the AC-DC conversion unit and the buck-boost mode power conversion unit through use of analogue feedback control signals and through a digital interface selected from one or more of Inter-Integrated Circuit (I2C), General Purpose Input-Out (GPIO), and other inter chip communication methods.

9. The method as claimed in claim 6, wherein each of the first USB port and the one or more second USB ports are a type-A port or a type-C port.

10. The method as claimed in claim 9, wherein the AC-DC conversion unit and the buck-boost mode power conversion units have an electrical correspondence with each other through a VOUT line.

* * * * *